United States Patent Office 3,782,939
Patented Jan. 1, 1974

3,782,939
DRY POSITIVE-ACTING PHOTORESIST

James A. Bonham, Pine Springs, and Panayotis C. Petrellis, Maplewood, Minn., assignors to Minnesota Mining and Manufacturing Company, St. Paul, Minn.

No Drawing. Filed Feb. 9, 1972, Ser. No. 224,949
Int. Cl. G03c 5/00
U.S. Cl. 96—35.1 7 Claims

ABSTRACT OF THE DISCLOSURE

A process for forming an imagewise pattern of a positive-acting photoresist material on a receptor surface is provide, wherein a dry film of photosolubilizable material, supported by a carrier sheet, is bonded to the receptor followed by exposure and development thereof to leave an image pattern on the receptor.

Conventional processes can then be used to treat the exposed receptor surface, e.g. etching, plating, etc.

FIELD OF THE INVENTION

The invention relates to processes for providing dry, positive-acting photoresists on a substrate. More particularly, it relates to processes for providing positive photoresist images utilizing photosolubilizable compositions.

BACKGROUND OF THE INVENTION

Photoresists are thin coatings which, when exposed to actinic radiation of proper wavelength, are changed in solubility characteristics to certain developing solutions in exposed as compared to unexposed areas of the coating. If the resist is positive-acting, light-exposed areas become more soluble to developing solutions, and can thus be selectively removed by these solutions. Thus, a positive resist image, i.e. one having the same contrast as the original, is provide. Conversely, negative-acting photoresists generally polymerize or crosslink in light-exposed areas such that they are less soluble than areas not exposed. Developing solutions can then remove the nonexposed areas, yielding a negative image, i.e. one that is exactly opposite to the original in tems of contrast. Resist paterns, after development, are chemically resistant to conventional cleaning, plating, or etching solutions commonly used in processes such as photo engraving, wherein for example electronic printed circuit boards are the desired end product.

Processes for forming a photoresist on a receptor surface are known. In general, the photosensitive material is applied to the receptor surface as a liquid coating, e.g. by dipping or other conventional coating techniques. The liquid coating is then dried for use as a photoresist. This method is inconvenient in many cases because it requires either that the receptor must be coated at the place of manufacture of the liquid resist composition, or the composition must alternatively be shipped to the resist user, who must then coat the composition. These piecemeal methods generally produce coatings of unacceptable quality and uniformity because the coating is dependent on the availability of proper equipment and the skill and technique of the operator. Additionally, the possibility of foreign objects being introduced into the coating during drying are great. These foreign objects may interfere with obtaining a high resolution image area.

Dry negative-acting photoresists on a support sheet are also known in the art. Generally, these photoresists utilize photopolymerization or photocrosslinking techniques as mentioned above in exposed image areas. The photosensitive surface is laminated to the receptor surface to provide a dry photoresist. The resist must generally be imaged through the support sheet. Upon removal of the support sheet, development of the image yields an image which is negative, i.e. in opposite contrast to the original. These dry photopolymerizable or crosslinkable resists have definite disadvantages also. In order to obtain a positive image, a reverse or negative of the original must be utilized. The photoresist, prior to the light exposure, is generally originally tacky, and thus removal of the support sheet becomes difficult prior to exposure. Thus, limited materials are available for support sheets utilizing these photopolymerizable or photocrosslinkable materials. Additionally, because of the relative tackiness of the unexposed material, a cover sheet is generally needed prior to use. This cover sheet adds to the overall expense, and must be removed prior to lamination to the receptor. Perhaps the greatest disadvantage is the extreme difficulty for a user who wishes to add on to or correct an in-situ imaged resist. Since the unexposed photoresist is removed during development, a user must overlay a second photoresist layer to add on, and the extreme difficulty of image registration virtually precludes one from doing so.

The present invention provides a process for obtaining a positive image of an original on a receptor surface, the process of the invention being more convenient, more versatile, and simpler than processes provided heretofore.

SUMMARY OF THE INVENTION

In accordance with the invention there is provided a process for obtaining a positive image of an original on a a receptor surface, the process comprising the steps of:

(a) providing a light-sensitive sheet comprising a flexible, dimensionally stable carrier sheet having releasably bonded to one surface thereof a layer of photosolubilizable material, (b) forming a firm bond between the photosolubilizable material and a receptor surface; then in either order of (c) and (d), (c) exposing the photosolubilizable layer to actinic radiation in an imagewise manner ethrough an original;

(d) removing the carrier sheet from the layer of photosolubilizable material;

(e) removing exposed areas of the photosolubilizable layer, whereby a positive image of the original is obtained which is firmly bonded to the receptor surface.

By utilizing a dry light-sensitive layer which is simply laminated to a receptor surface, the problems and disadvantages attendant with liquid light-sensitive compositions are eliminated. Because the unexposed areas of the dry light-sensitive layer (i.e. photoresist) remain on the receptor after development, and also remain light-sensitive, one can easily add on (i.e. obtain further positive images in the light-sensitive layer) by exposing previously unexposed areas through an original. Thus, the process provided by the present invention is more convenient, more versatile, and simpler than processes utilizing negative-acting light-sensitive materials.

DETAILED DESCRIPTION OF THE INVENTION

Photosolubilizable compositions useful in the process of the invention are those which are rendered selectively developable when exposed to actinic radiation, allowing removal of the exposed areas while unexposed areas remain intact.

The photosolubilizable composition is typically coated onto a carrier sheet from a solvent solution or dispersion and dried to leave a light-sensitive layer which is releasably bonded to the carrier sheet. In the process of the invention one surface of the described light-sensitive layer is firmly bonded to the desired receptor surface. This bond is typically formed by means of heat (e.g. 40–150° C.) and pressure sufficient to assure uniform contact between the light-sensitive layer and the receptor surface such that a firm bond is formed thereby. The carrier sheet is typically removed before the light-sensitive layer is exposed to actinic radiation, although such exposure can be made through the carrier sheet when it is transparent to actinic radiation. Upon development of the exposed light-sensitive layer, a positive image of the original is obtained on the receptor surface.

Examples of photosolubilizable compositions useful in the invention include the quinone diazide-containing compositions which become alkaline soluble on light exposure, e.g. quinone diazide sulfonic acid esters of polyhydric arylene compounds as disclosed in U.S. Pat. Nos. 3,406,118, 3,406,119, 3,406,121, 3,106,465; and others; the quinone diazide aryl sulfones disclosed in U.S. Pat. No. 3,046,112; the hydrazine derivatives of quinone diazide sulfonic acids disclosed in U.S. Pat. No. 2,766,118; the azole amides or quinone diazide sulfonic acids disclosed in U.S. Pat. No. 2,907,655; and the quinoline quinone diazides disclosed in U.S. Pat. No. 2,859,112.

A preferred class of suitable photosolubilizable compositions are those disclosed in assignee's copending U.S. application (Ser. No. 224,918, filed of even date) incorporated herein by reference. The photosensitive compositions disclosed therein are comprised of a photolizable acid progenitor and water-insoluble organic compounds containing groups which are degradable in acidic environments. Upon exposure of the composition to actinic light, the acid progenitor photolyzes to generate an acidic condition which in turn catalyzes the degradation of the acid-degradable groups such that the exposed areas become solubilized relative to the unexposed areas.

The preferred compounds containing acid-degradable groups are in general prepared by the nucleophilic addition reaction of organic compounds containing one or more alkyl vinyl ether groups with organic compounds containing one or more aromatic hydroxyl groups, aromatic monoalkylsulfonamide groups, i.e. $—RNHSO_2Ar$ where R is a lower alkyl group and Ar is a monovalent or divalent aromatic group, or the secondary aromatic amines phenothiazine or α-naphthylphenylamine. These compounds can be nonpolymeric or polymeric, and where polymeric, the acid-degradable groups can be within or pendent to the polymeric backbone. The acid-degradable groups within the addition reaction product can be generally depicted by the formula

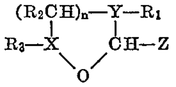

where $n$ is zero, 1, 2, or 3. When $n$ is zero, X and Y are $—CH_2—$ and $R_1$ is hydrogen or lower alkyl; when $n$ is 1, 2, or 3, X and Y are —CH—, $R_1$ is hydrogen, and $R_2$ is hydrogen or lower alkyl. $R_3$ is hydrogen, a monovalent aliphatic radical, or a divalent organic radical, and Z is selected from the group consisting of —OAr, $—NRSO_2Ar$,

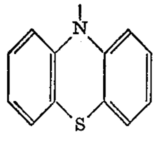

and

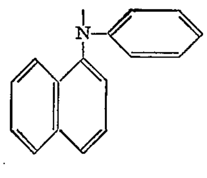

where Ar is a monovalent or divalent aromatic group and R is a lower alkyl group. (Lower alkyl in all cases signifies no more than about four carbon atoms, which can be branched or unbranched.)

When $R_3$ is a divalent organic radical, it serves to link one acid-degradable group to another. Ether, ester, urethane, amide, non-basic amino, and urea linkages are typical of such divalent organic radicals.

An example of a compound containing acid-degradable groups falling within the above formula is

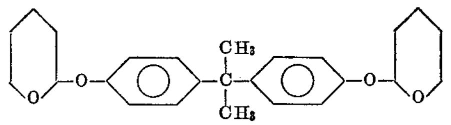

which is bis-2-tetrahydropyranylether of 4,4'-isopropylidene diphenol.

The photosolubilizable compositions should preferably have a stick or transfer temperature between about 40° C. and about 150° C. Too high a stick temperature may cause the flexible carrier sheet to begin to warp during lamination to a receptor and thus non-uniform contact may result. This stick temperature is generally governed by the particular photosolubilizable composition utilized and by desirable film-forming polymeric binders incorporated therein.

In some instances, the photosolubilizable composition itself will have adequate film-forming capability and thermoplasticity, especially where the composition is polymeric. When desired, however, thermoplastic film-forming polymeric binders can be included. Example of suitable polymeric materials include polyvinylchloride and polyvinylacetals, e.g. polyvinylformal and polyvinylbutyral.

A preferred class of thermoplastic film-forming polymeric binders are the novolac phenol/aldehyde condensation polymers such as are disclosed in U.S. Patent No. 3,514,288.

Generally, one part by weight of photosolubilizable material may be used with up to about 9 parts or more by weight of polymeric binder. When the photosolubilizable material itself is polymeric, weight ratios of photosolubilizable material to polymeric binder of 1:0 to about 1:0.5 are preferred. When the photosolubilizable material is not polymeric, the preferred ratio of photosolubilizable material to binder is in the range of about 1:4 to about 1:8.

In addition to photosolubilizable materials, and where desirable a film-forming thermoplastic polymeric binder the light-sensitive layer may contain minor amounts, i.e. less than about 10% by weight of other components to impart certain desirable characteristics to the elements used in the process of the invention, e.g. to improve adhesion of the photosolubilizable composition to the carrier sheet, adhesion to the receptor surface on lamination, abrasion resistance, chemical inertness, etc. Thus, if desired, the light-sensitive layer may contain non-thermoplastic polymeric materials including polyvinylalcohol, cellulose, particulate phenolic resins, and the like. Polymeric materials such as polyvinyl chloride and polyvinyl ethers can be included to plasticize the thermoplastic light-sensitive layer. Inorganic materials which are essentially transparent to actinic radiation at the wavelengths used for exposure of the photosensitive element may be added to improve internal strength of the composition, reduce tack, and improve abrasion resistance. Examples of such materials include glass microspheres and microbubbles, powdered glass, sand, clays, colloidal carbon and the like.

Various dyes, pigments, and color-forming components may be added to the thermoplastic photosolubilizable composition. Generally, these components can be present in concentrations of up to about 20 weight percent, thus enabling the production of densely colored photoresists which can be visually examined for resolution.

The photosolubilizable compositions can in general be prepared by mixing the components in a suitable solvent. When insoluble pigments or other insoluble particulate materials are among the components utilized in the composition, conventional techniques such as ball-milling will generally be required.

Suitable solvents for the preparation of the thermoplastic photosolubilizable composition include hydrocarbon solvents, for example, benzene, toluene; etc.; ketones, such as acetone, methylethylketone, methylisobutylketone; chlorinated hydrocarbons, such as methylene chloride, ethylene chloride, etc.; and the like. Application concentrations of the thermoplastic composition are generally about 10 to about 40 percent solids content and preferably about 20 to about 35 percent solids content. Generally, concentration will be limited by the application equipment available to the user. For example, higher concentrations will require smaller coating orifices and close tolerances, etc.

The photoesnsitive sheet material utilized in the invention can generally be prepared by coating solutions or dispersions of the thermoplastic photosolubilizable composition on a suitable support or carrier sheet in any well known manner, such as by exrtusion, dip coating, knife coating, etc.

To effect efficient bonding of the photosolubilizable layer to a receptor, preferred coating weights of the photosolubilizable material on the carrier sheet are in the range of 100 to 1000 milligrams per square foot. Extremely low coating weights may result in tearing of the layer on transfer while exceedingly high coating weights may result in a brittle coating.

The carrier sheet or support useful in the process of the invention are flexible and dimensionally stable. Where image exposure is through the carrier sheet, it is apparent the sheet must be transparent to actinic radiation. Examples of suitable carrier sheets include films of polyester, such as polyethylene terephthalate; polyamides such as hexamethylenediamine adipamide; polyolefins; vinyl polymers such as polyvinylchloride, and polyethylene-coated paper and glassine.

Carrier films of polyester can be untreated film, corona discharged film, primed film, or photographic subbed polyester (gelatin/acrylate mixture subbing). To improve release from the photosolubilizable layer, a carrier sheet can be treated (i.e. can be provided with a release coating on at least one surface thereof). For example, the carrier sheet can be coated with conventional release agents, e.g. silicones, waxes, or polyvinylalcohol.

Any receptor surface whereon a photoresist is desirable is useful in the process of this invention. For example, the surface can be rigid or flexible, metallic or non-metallic, non-porous or porous, or may be any other type of substrate, e.g. glass or ceramic. When printed circuit boards are desired, the receptor may comprise a dielectric substrate having a layer or pattern of conductive metal bonded to at least one surface thereof.

In the practice of this invention, the photosolubilizable photoresist layer releasably bonded to its support is bonded at temperatures of preferably from about 40° C. to about 150° C. to the receptor surface with enough pressure being applied to maintain uniform contact between the resist layer and the receptor surface. If the support sheet is transparent to actinic radiation, the photoresist layer can typically be imaged through this support material to actinic light through a positive original for a sufficient period of time to effect the solubilization of the exposed areas of the resist layer. The transparent support sheet can then be moved from the resist layer leaving the imaged resist layer adhering to the receptor surface. Alternatively, the support sheet can be removed prior to imaging of the photoresist layer. Since the photoresist layer is non-tacky at ordinary room temperature conditions, there is no problem of the original sticking to the photoresist layer during imaging. The imaged resist layer can then be developed with a suitable developing solution using mild abrasion with a soft swab pad or sponge to accelerate the removal of the exposed areas. Swabbing for about 30 seconds to about 5 minutes is generally sufficient to remove the image exposed solubilized areas of the resist layer. If the photoresist layer is colored, the resist image can be examined for resolution, and since the unexposed areas of the resist layer remained light sensitive, image corrections or additions thereto can be made.

Conventional techniques, such as electroplating, etching, etc., can be performed on the substrate, which is unprotected by the photoresist in imaged areas.

The photoresist layer remaining on the substrate after the subsequent processing exposed substrate can be easily removed, if desired, by light exposing and washing with normal developer solutions.

The invention will be further illustrated by the following detailed examples, wherein all parts unless otherwise stated, are by weight.

EXAMPLE I

A photosolubilizable composition is prepared by dissolving under subdued light:

| | Parts |
|---|---|
| Toluene | 100 |
| "Alnoval 429K," a cresol-formaldehyde resin available from the American Hoechst Company | 14 |
| "Gantrez M555," a 50% polyvinyl methyl ether in toluene available from the General Aniline company | 12 |
| Bis(2-tetrahydropyranyl) ether of Bisphenol A | 10 |
| 2,4-bis(trichloromethyl) - 6 - (4-methoxystyryl)-s-triazine | 0.45 |

The solution is knife coated at a four mil wet thickness onto four mil polyethylene film and dried at about 65° C. for about 10 minutes.

The positive film resist product is used to prepare an electronic circuit by laminating the resist product to flexible copper clad circuit material on a heated roll laminator at about 65° C. The polyethylene film is readily stripped from the laminate leaving the resist layer adhered to the copper surface. The laminate is covered with a circuit mask and exposed at a distance of 24 inches to a 2000 watt ultraviolet source (Colight, Inc.) for 2.5 minutes, and is developed with a one percent aqueous sodium hydroxide solution for 2 minutes.

The exposed copper is then electrolytically plated with gold following standard industrial procedures. The remaining resist is then light exposed and washed away with the developer solution. Photomicrographs of the plated patterns showed excellent resolution for the four mil lines and three mil spacings of the circuit pattern.

The above process is successfully repeated using polypropylene film as the resist support material, and exposing through the support film.

EXAMPLE II

A positive working liquid photo resist, "Azoplate, AZ-111," made by Shipley Co., Newton, Mass., is coated on a four mil polyethylene film and dried at 65° C. for 10 minutes.

This dry photo resist is then laminated to the copper surface of Example I on a hot plate at 70° C. and the polyethylene stripped away. The sample is then exposed to the UV light source of Example I for 2½ minutes. The resist layer is developed with the recommended Shipley developer, "AZ-303."

A circuit pattern with excellent resolution and line development is obtained.

Similar results are obtained if the polyethylene film is removed prior to exposure.

EXAMPLE III

A photo solubilizable composition is prepared by mixing under subdued light:

| | Parts |
|---|---|
| Methylethyl ketone | 3 |
| "Alnovol 429K" from Example I | 2 |
| 1,2-naphthoquinone diazide-5-p-tert-butyl phenyl sulfonate | 0.6 |

The solution is coated onto 4 mil polyethylene and dried at 65° C. for 10 minutes.

The dry positive film resist is laminated to copper foil on a hot plate at about 70° C. The polyethylene carrier sheet is then stripped away and the sample exposed through a circuit mask to the UV light of Example I for 2½ minutes. The sample is then developed with a 1% aqueous sodium hydroxide solution for 2 minutes yielding the desired circuit pattern.

What is claimed is:

1. A process for obtaining a positive image of an original on a receptor surface, the process comprising the steps of:

(a) providing a light-sensitive sheet comprising a flexible, dimensionally stable carrier sheet having releasably bonded to one surface thereof a layer of photosolubilizable material, said photosolubilizable material having a stick temperature between about 40° C. and 150° C. and being non-tacky at ordinary room temperature condition;

(b) forming a firm bond between said photosolubilizable material and a receptor surface; then in either order of (c) and (d);

(c) exposing said photosolubilizable material to actinic radiation in an imagewise pattern through an original;

(d) removing said carrier sheet from said layer of photosolubilizable material;

(e) removing exposed areas of said photosolubilizable layer, whereby a positive image of said original is obtained on said receptor surfaces.

2. The process of claim 1 wherein said photosolubilizable layer comprises:

(a) a water-insoluble organic compound containing one or more acid-degradable groups, the group having the formula

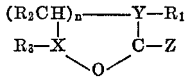

where $n$ is zero, 1, 2, or 3; wherein when $n$ is zero, X and Y are —$CH_2$— and $R_1$ is hydrogen or lower alkyl; and when $n$ is 1, 2, 3, X and Y are —CH—, $R_1$ is hydrogen, and $R_2$ is hydrogen or lower alkyl; and wherein $R_3$ is hydrogen, a monovalent aliphatic radical, or a divalent organic radical; and Z is selected from the group consisting of —OAr, —$NRSO_2Ar$.

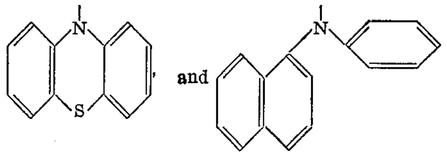

where R is a lower alkyl group and Ar is a monovalent or divalent aromatic group; and (b) a photoinitiator comprising a photolyzable acid progenitor which is normally non-reactive but which, upon absorption of actinic radiation, is capable of generating an acidic condition.

3. The process of claim 1 wherein said flexible carrier sheet is untreated polyester.

4. The process of claim 3 wherein said untreated polyester is polyethylene terephthalate.

5. The process of claim 1 wherein said flexible carrier sheet is treated polyester.

6. The process of claim 1 wherein said receptor comprises a dielectric substrate having a thin layer of metal bonded to at least one surface thereof, and wherein said photosolubilizable layer is bonded to said metal layer.

7. The process of claim 6, wherein said metal layer is copper.

References Cited

UNITED STATES PATENTS

| | | | |
|---|---|---|---|
| 3,515,552 | 6/1970 | Smith | 96—115 P |
| 3,558,311 | 1/1971 | Delzenne et al. | 96—115 R |
| 3,211,553 | 10/1965 | Ito | 96—33 |
| 2,767,092 | 10/1956 | Schmidt | 96—33 |
| 3,046,119 | 7/1962 | Sus | 96—33 |
| 3,113,023 | 12/1963 | Mellan | 96—33 |
| 2,865,745 | 12/1958 | Chan et al. | 96—28 |
| 3,080,230 | 3/1963 | Haydn et al. | 96—28 |
| 3,091,528 | 5/1963 | Buskes | 96—28 |

NORMAN G. TORCHIN, Primary Examiner

E. C. KIMLIN, Assistant Examiner

U.S. Cl. X.R.

96—115 R, 28

UNITED STATES PATENT OFFICE

CERTIFICATE OF CORRECTION

Patent No. 3,782,939 Dated January 1, 1974

Inventor(s) James A. Bonham et al.

It is certified that error appears in the above-identified patent and that said Letters Patent are hereby corrected as shown below:

Column 1, line 37, "provide" should read -- provided --.

Column 2, line 39, "ethrough" should read -- through --.

Column 7, claim2, in the formula, "C-Z" should read -- CH-Z --.

Signed and sealed this 7th day of January 1975.

(SEAL)
Attest:

McCOY M. GIBSON JR.
Attesting Officer

C. MARSHALL DANN
Commissioner of Patents